(12) United States Patent
Ray (10) Patent No.: US 7,003,871 B2
(45) Date of Patent: Feb. 28, 2006

(54) SOLDER PASTE STENCIL MANUFACTURING SYSTEM

(75) Inventor: Michael Ray, Hayden Lake, ID (US)

(73) Assignee: Integrated Ideas & Technologies, Inc., Coeur d'Alene, ID (US)

(*) Notice: Subject to any disclaimer, the term of this patent is extended or adjusted under 35 U.S.C. 154(b) by 15 days.

(21) Appl. No.: 10/677,640

(22) Filed: Oct. 1, 2003

(65) Prior Publication Data

US 2005/0071996 A1 Apr. 7, 2005

(51) Int. Cl.
H01R 43/00 (2006.01)
(52) U.S. Cl. .......................... 29/825; 29/832; 29/840; 29/846
(58) Field of Classification Search ................ 29/825, 29/846, 832, 840; 101/129, 123
See application file for complete search history.

(56) References Cited

U.S. PATENT DOCUMENTS

| | | | |
|---|---|---|---|
| 5,107,759 A | | 4/1992 | Omori et al. |
| 5,483,884 A | * | 1/1996 | Vellanki ...................... 101/129 |
| 5,704,287 A | | 1/1998 | Omori et al. |
| 5,751,910 A | * | 5/1998 | Bryant et al. ................... 706/2 |
| 5,755,157 A | | 5/1998 | Omori et al. |
| 5,982,927 A | * | 11/1999 | Koljonen ..................... 382/168 |
| 6,587,580 B1 | * | 7/2003 | Nikmanesh ................. 382/145 |
| 6,738,505 B1 | * | 5/2004 | Prince ......................... 382/150 |
| 6,766,736 B1 | * | 7/2004 | Regner et al. .............. 101/127 |

OTHER PUBLICATIONS

"T3 Laser Solder Cutting System"; Tech Source International, Inc.; Jan. 2004; 2 pp.
"Stencil Cutting Laser Workstation"; Directed Light, Inc.; www.hot-beam.com; 1 p.
"SMT Stencil Technology"; hhtp://www.lpkfusa.com/SMTStencil/Index.html; Mar. 29, 2004; 3 pp.
"Laser Stencil System" "LSS800"; SYNOVA; 5 pp.

\* cited by examiner

Primary Examiner—Carl J. Arbes
(74) Attorney, Agent, or Firm—Wells St.John P.S.

(57) ABSTRACT

A method and apparatus for manufacturing or assembling a plurality of printed circuit boards to reduce rework at a printed circuit board assembly facility, which may include the following: cutting a first solder paste stencil based on a first solder paste stencil data set on a solder paste stencil cutting machine or device; utilizing the first stencil to apply solder paste to a first printed circuit board at a manufacturing or assembly facility; identifying a solder paste error condition with solder paste error information on the first printed circuit board; transmitting the solder paste error information for remote analysis; generating an adjusted first data set; transmitting the adjusted first data set to the printed circuit board manufacturing or assembly facility; utilizing the adjusted first data set to cut another solder paste stencil based on the adjusted stencil data; and utilizing the adjusted first solder paste stencil to manufacture a second printed circuit board without the solder paste error condition.

10 Claims, 5 Drawing Sheets

SOLDER PASTE STENCIL MANUFACTURING SYSTEM

CROSS REFERENCE TO RELATED APPLICATION

There are no related applications.

TECHNICAL FIELD

This invention pertains to a system for the manufacture of solder paste stencils, including without limitation, such an apparatus and method which expedites the overall process and which may also reduce the rework of printed circuit boards and other parts on which solder paste is applied.

BACKGROUND OF THE INVENTION

This invention relates to a system for the production or manufacture of solder paste stencils and the use of a solder paste stencil system in the manufacture or assembly of other components such as printed circuit boards.

In the manufacture of printed circuit boards, solder paste is applied to a printed circuit board through the use of very precisely cut stencils. The traces or pads which are desired on the printed circuit board are typically small and intricate, and include short distances or clearances between paste locations.

Due to the intricacy of the work and the demands of the manufacturing or assembly facility, there are several different problems which may develop or occur on the printed circuit board during or as a result of the solder pasting process, such as bridges or bridging (may occur when a particular pad is long and the lead is short), opens, shorts, tomb-stoning, shifting, re-flows, and solder balling, to name a few. Some of these problems may partially be as a result of stencils being built from data provided from a third party source (designer) with a footprint design that is not precise to the physical printed circuit board. The term pad as used herein typically refers to locations where solder is to be placed or applied, but may also be referred to as a contact. The mounting and/or assembly of electronic components on printed circuit boards may also be referred to as surface mount technology.

In a typical semiconductor or electronics manufacturing or assembly facility it is expensive to set up a production line, and likewise costly to incur downtime with the line. In order to reduce the downtime of a line running a particular printed circuit board, manufacturers may finish a manufacturing or assembly run on a particular printed circuit board, and then rely on remedial efforts to correct the undesired or solder paste error condition. These remedial efforts may be referred to as rework, and rework costs the industry millions of dollars each year.

In other situations, the delays which may be sustained by mailing (even if by courier) of stencils, delays the manufacturing or assembly start times, sometimes longer than desired.

In the current typical arrangement, semiconductor or electronics manufacturers or product assemblers utilize third party stencil manufacturers, producers or job shops, who have the requisite design knowledge, expertise and equipment to make the stencils appropriate for the specific applications and to hopefully maximize their performance. The semiconductor or electronics manufacturer typically provides the relevant design information to the stencil manufacturer, who designs, manufactures and then physically ships the stencil to the semiconductor or electronics manufacture. While the turnaround time is acceptable in some situations, in other situations it causes manufacturing downtime to the production facility of the semiconductor or electronics manufacturer.

The stencils utilized are well known in the art and are typically (but need not be) approximately five one-thousandths of an inch thick and of know materials and general configurations.

The current methods require assemblers to rely on additional personnel to rework and fix the boards, and then wait on stencil corrections corresponding to the board corrections, all the while losing valuable production and production time. In some cases wherein the stencil has an error in it, or the design to the physical board includes an error, there may be additional delays.

An example of a possible rework is the flow of solder paste between two pads or areas targeted to receive solder paste, which may create a short between the two. Depending on the location and other factors, the rework of that short may take an hour or two of time of a rework employee. When a high number of boards require rework, the cost is significant. Some estimate that rework of some sort is required on fifteen or twenty percent or more of printed circuit boards.

If time is critical, the assembly facility may use the stencil despite problems in the stencil or its compatibility to the board, potentially causing substantial board rework problems. This is a re-occurring problem in the industry today.

It is an object of embodiments of this invention to provide a solder paste stencil manufacturing system which reduces the rework on printed circuit boards at a manufacturing or assembly facility.

BRIEF DESCRIPTION OF THE DRAWINGS

Preferred embodiments of the invention are described below with reference to the following accompanying drawings.

FIG. 4 is a front elevation schematic representation of an embodiment of part of a laser based solder paste stencil cutting machine or device contemplated by an embodiment of this invention;

DETAILED DESCRIPTION OF THE PREFERRED EMBODIMENTS

Many of the fastening, connection, manufacturing and other means and components utilized in this invention are widely known and used in the field of the invention described, and their exact nature or type is not necessary for an understanding and use of the invention by a person skilled in the art or science; therefore, they will not be discussed in significant detail. Furthermore, the various components shown or described herein for any specific application of this invention can be varied or altered as anticipated by this invention and the practice of a specific application or embodiment of any element may already be widely known or used in the art or by persons skilled in the art or science; therefore, each will not be discussed in significant detail.

The terms "a", "an", and "the" as used in the claims herein are used in conformance with long-standing claim drafting practice and not in a limiting way. Unless specifically set forth herein, the terms "a", "an", and "the" are not limited to one of such elements, but instead mean "at least one".

In one aspect of this invention, this process may be utilized to produce a quality stencil the first time, without the need for rework or for adjustments to the design of the stencil.

In another aspect of this invention is a method for manufacturing a plurality of printed circuit boards to reduce rework at a printed circuit board manufacturing or assembly facility, comprising: cutting or producing a first solder paste stencil utilizing a first solder paste stencil data set; utilizing the first solder paste stencil to apply solder paste to a first printed circuit board at a printed circuit board manufacturing or assembly facility; identifying a defect, which may for instance be a solder paste error condition (which may originate in the printed circuit board design or with the solder stencil, or some combination thereof) with solder paste error information on the first printed circuit board; transmitting the solder paste error information for remote analysis, possibly at a remote location; generating an adjusted first solder paste stencil data set; transmitting the adjusted first solder paste stencil data set to the printed circuit board manufacturing or assembly facility; utilizing the adjusted first solder paste stencil data set to cut an adjusted first solder paste stencil based on the adjusted first solder paste stencil data; and utilizing the adjusted first solder paste stencil to manufacture a second printed circuit board without the solder paste error condition.

In the design of a cutting pattern for a solder paste stencil, the board manufacturer will typically provide a stencil job shop the board data by providing the stencil expert data files which include board data by which the printed circuit board will be manufactured. The stencil job shop may then read or interpret the data and sort through the data to determine the best stencil pattern to accomplish the solder paste pattern on the particular printed circuit board. Since the printed circuit board data files typically include circuit and other data which is not needed by the stencil job shop, that data will typically be removed from the data file in arriving at a stencil data set.

The stencil job shop will typically then modify the printed circuit board data file to improve or optimize the data files and stencil cutting instructions, parameters or process. This is part of the engineering or design of the stencil.

Once the stencil designer (such as a job shop) changes the parameters as received from the printed circuit board manufacturer or assembler, the data may then be utilized by standard stencil design software to further set up the stencil cutting process. This modification process may be accomplished with available and known software products, such as the software available from Lavenier or Graphic Code.

Once the original stencil cutting data is complete, the first solder paste stencil(s) may be cut based on this first solder paste stencil data set. In the current typical arrangement, the first solder paste stencil(s) are then shipped to the semiconductor or electronics manufacturer or assembler and utilized in the manufacturing process in the application of solder paste.

In the manufacturing process or assembly process, the printed circuit boards would typically be inspected and/or tested, and it is then that the manufacturer may identify a solder paste error condition, thereby obtaining or generating solder paste error information on the first printed circuit board made. This may include (but is not limited to) error conditions such as bridging, reflow, shorting, etc. In the typical current arrangement, the manufacturer or assembler will either stop production immediately or finish a production run depending on the error and the other circumstances.

The manufacturer will then transmit the solder paste error information back to the stencil designer/manufacturer or job shop for analysis and to generate an adjusted first solder paste stencil data set. The stencil designer will then typically manufacture a new stencil and ship it back to the manufacturer or assembler of the printed circuit boards. It is appreciated that this procedure takes an undesired amount of time, even if expedited, due mainly to the physical shipping of the stencil.

In an embodiment of this invention, the manufacturer or assembler of the printed circuit boards would have a solder paste stencil manufacturing machine or device on its own site (as described below). The manufacturer or assembler would generate the solder paste error information on the first printed circuit board and electronically transmit or telefax it to the stencil manufacturer or job shop. The stencil designer or job shop may then analyze the solder paste error information on the first printed circuit board and make adjustments to the stencil design to eliminate the error, and create an adjusted first solder paste stencil data set to allow the cutting of a new stencil.

The adjusted first solder paste stencil data set may then be transmitted back to the printed circuit board manufacturing or assembly facility, where it is entered or downloaded into the solder paste stencil manufacturing machine or device. The solder paste stencil manufacturing machine or device then utilizes the adjusted first solder paste stencil data set to cut an adjusted first solder paste stencil based on the adjusted first solder paste stencil data. The adjusted first solder paste stencil may then be utilized to manufacture a second printed circuit board without the solder paste error condition.

As will be appreciated by those of ordinary skill the art, this overall process of this aspect of the invention may be accomplished in a couple of hours or less, as compared to days when the stencils are re-engineered or designed off-site and then re-shipped. It is estimated that this time savings as well as the reduction of rework, will save manufacturers and assemblers substantial expense. It is also believed that manufacturers or assemblers with multiple facilities making production runs on the same board will be able to achieve better uniformity and consistency in the manufacture of that board at multiple facilities.

The manufacturing system components may include a laser based stencil cutter, a motion system such as (or which may include) an x-y controller, a laser beam delivery system, a chiller, a frame and housing, and a frame mounting fixture for mounting and locating the stencil frame to the system or within the framework.

It is preferable that a manufacturer or assembler of printed circuit boards who has a solder paste stencil manufacturing machine or device, also be provided a pre-packaged stencil framework with the appropriate stencil already bonded, framed or attached to the stencil workpiece framework. This will allow the manufacturer or assembler to simply place a stencil workpiece in a framework on the stencil manufacturing machine or device to cut the stencil.

It will be appreciated by those of ordinary skill in the art that aspects of this invention will allow the printed circuit board manufacturer or assembler to avoid the additional cost of a full stencil manufacturing job shop and personnel required therefore.

It will also be appreciated by those of ordinary skill in the art that the electronic transmission of electronic data sets may be preferably transmitted in any one of a number of ways, such as emailing a file over the internet or over an intra-net, direct connection between the stencil designer or job shop and the manufacturing or assembly facility, or others. At the manufacturing or assembly side, the original or the adjusted data file may be directly received by the solder paste stencil manufacturing machine or device, or alternatively received elsewhere at or on behalf of the manufacturing or assembly facility, and transferred by other storage or transfer media, all within the contemplation of this invention.

In one aspect of the invention, the system may (but need not) include the following: a laser power supply (such as may be acquired from Lee Laser); a motion system with x-y controllers and/or tables (such as may be acquired from Anorad Motion Systems); an x-y controller which for instance may be an Anorad CNC 2000 Positioning Controller (which may be personal computer based)[Anorad Corporation, Hauppauge, N.Y.]; a chiller; a beam delivery system; a table for the motion system; a stand or framework for the laser; a frame-holding fixture for attachment to the motion system or x-y table; a chip or vacuum removal system; and an gas or oxygen delivery system. While the gas utilized may be oxygen, this invention is not limited to any one particular gas and oxygen is merely one of several which may be used within the contemplation of this invention.

The table for the motion system described above may further include a chip or cut piece collection system, which may be a drawn air system to control the disposal of the chip or cut piece once it separates from the stencil. It is preferable to locate the drawn air device or vacuum on the opposite side (typically the underside to allow gravity to assist in the collection) of the stencil workpiece than the laser so the cut pieces or chips are drawn away from the laser beam and do not impede or block the laser beam as it continues to cut the desired stencil pattern on the workpiece.

Figure 5:
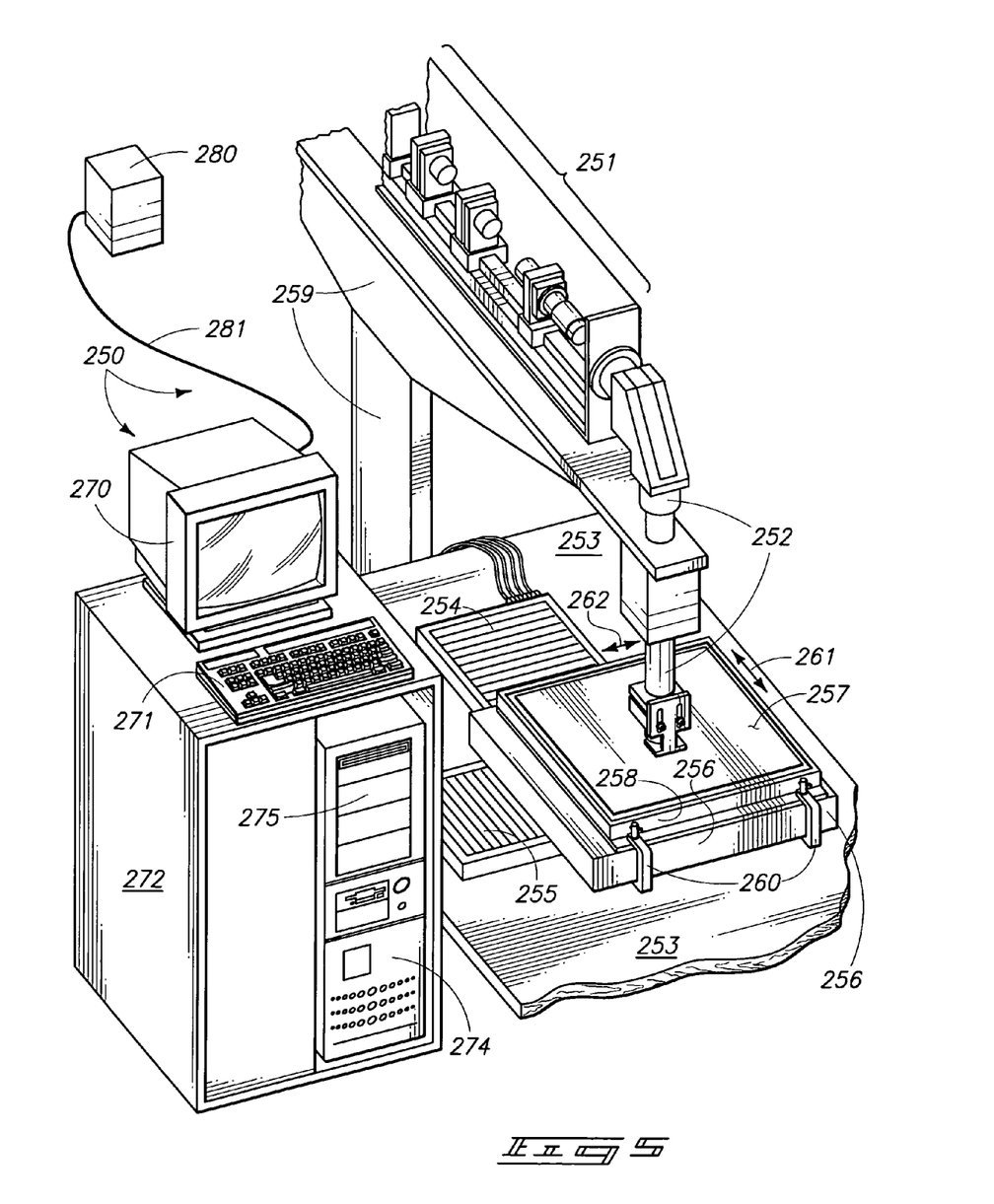
FIG. 5 is a perspective view of one embodiment of part of a laser based solder paste stencil cutting machine or device contemplated by an embodiment of this invention.

The workpiece holding framework may be as shown and described in FIG. 5, and preferably includes an integrated solder paste stencil workpiece from which the solder paste stencil will be cut, tensioned within a framework for ease of consistent location and cutting of the solder paste flow apertures in the stencil. Having a pre-mounted stencil blank tensioned on a stencil frame of one or more pre-determined sizes and/or configurations will allow the printed circuit board manufacturer or assembler to simply insert and/or attach the stencil framework and start the laser cutting process on the stencil workpiece.

It will also be appreciated by those of ordinary skill in the art that any one of a number of motion systems, tables or devices (and controllers thereof), may be utilized within the contemplation of this invention, with no one in particular being required to practice this invention. For instance the motion system or x-y table may also have a z axis motion feature, and it may be accomplished by servo type devices, by magnetic based devices, or any others which may provide the desired precise movement.

A feature of one aspect of this invention as described herein is that the solder paste stencil manufacturing machine or device is that it may be operated by lower skilled employees, thereby further reducing the cost of the system.

Embodiments of this invention may also allow manufacturing or assembly facilities to have customized solder paste stencil manufacturing machines or devices, making it easier to cut or produce their own solder paste stencils, for instance with customized jigs corresponding to the sizes of the stencil workpiece frameworks utilized.

Figure 1:
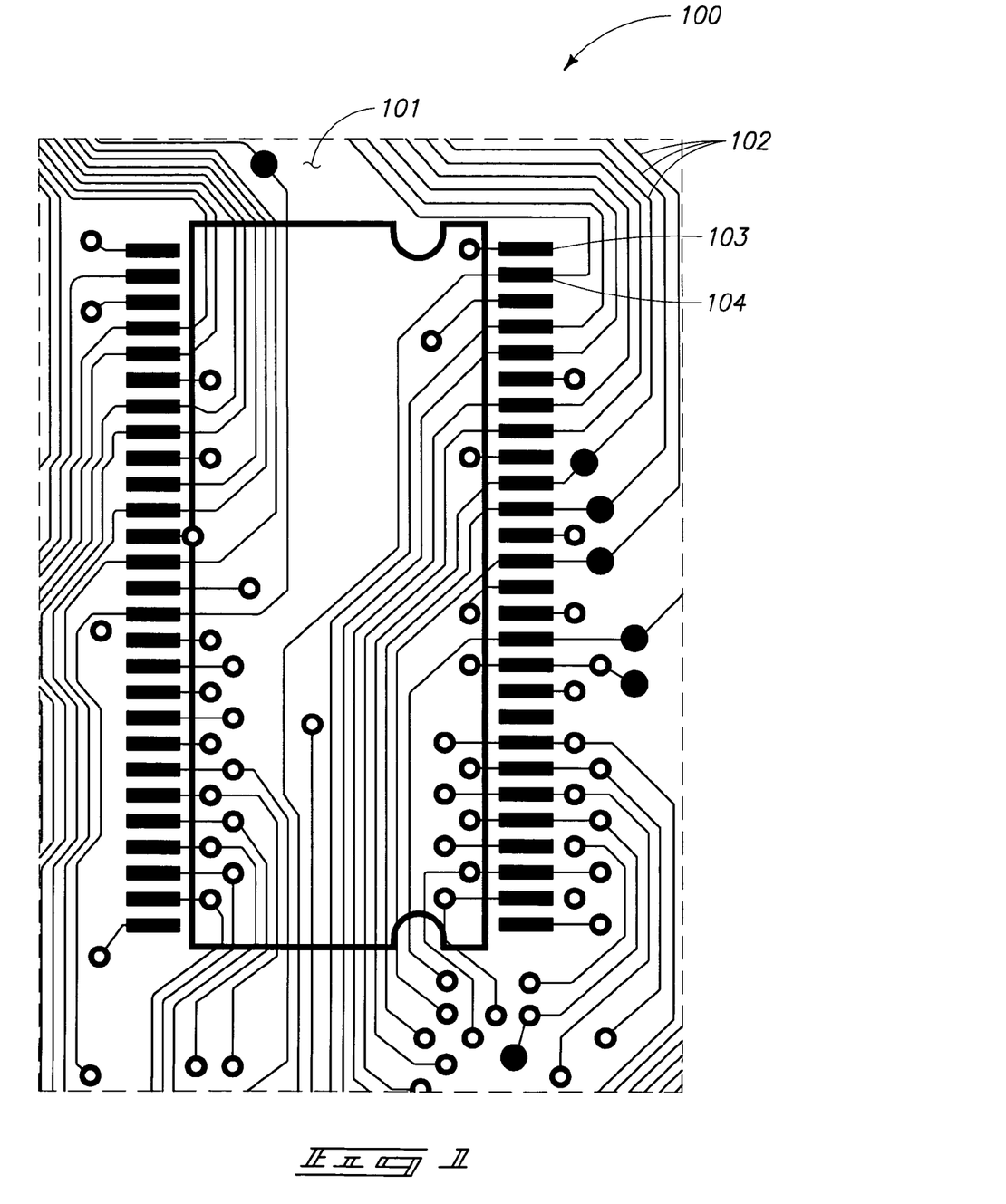
FIG. 1 is a top schematic view of a portion of an exemplary printed circuit board, illustrating pads and other locations where solder paste may be applied via a solder paste stencil.

FIG. 1 is a top schematic view of a portion of an exemplary printed circuit board 100, illustrating printed circuit board body 101, conductor traces 102, first solder pad 103 and second solder pad 104. The solder pads 103 & 104 for example, are locations where solder paste may be applied via a solder paste stencil. While the scale of the pads in FIG. 1 may be any scale, in practice many of the pads such as 103 and 104 are a very short distance apart, rending the possibility of the undesired flow of solder from one to the other much greater (which would generally require or result in rework).

Figure 2:
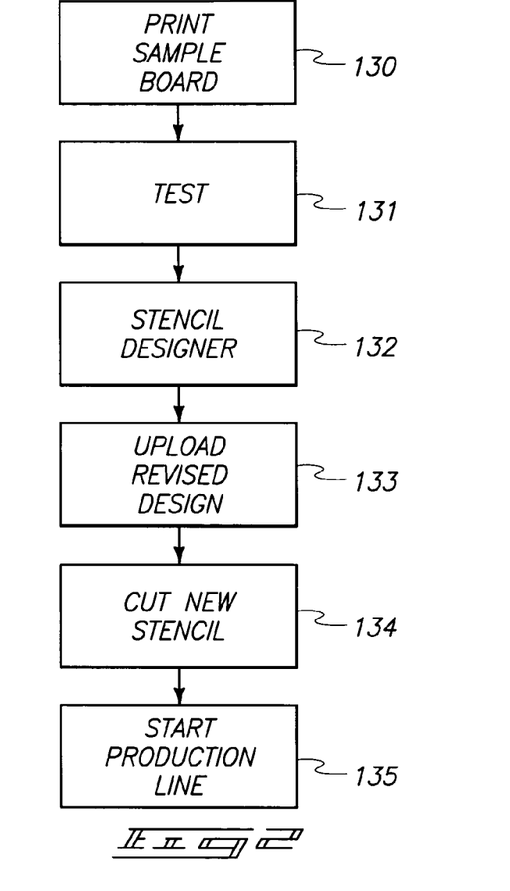
FIG. 2 is a flow diagram of one embodiment of a system which may be utilized as contemplated by this invention.

FIG. 2 is a flow diagram of one embodiment of a system which may be utilized as contemplated by this invention, showing the following steps: printing a sample printed circuit board 130, inspecting and/or testing 131 the sample board; transmitting the test results back to the stencil designer 132, who then makes the changes to the stencil data set thereby creating an adjusted first solder paste stencil data set; the stencil designer then transmits or uploads 133 (typically from a remote location) the adjusted first solder paste stencil data to the solder paste stencil cutting machine or device; box 134 illustrates that the solder paste stencil cutting machine or device produces a new or adjusted stencil; and box 135 representing the use of the adjusted stencil in the application of solder paste to printed circuit boards in the production line.

The term remote location as used in connection with this invention and the location of the stencil designer, means any location not adjacent the stencil cutter, such as from thousands of miles away, two miles away (by way of example and not to limit), in another building of the assembly facility or manufacturing facility, or at another location within the same building at the assembly or manufacturing facility, to name a few.

Figure 3:
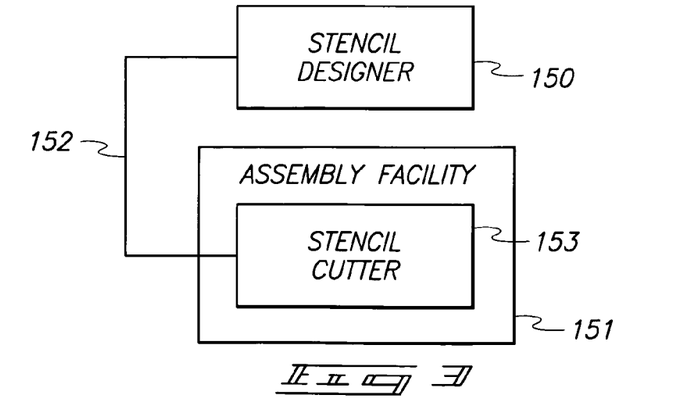
FIG. 3 is a diagram of one embodiment of a system which includes an electronic transmission or communication system between a stencil designer and the stencil cutter in an assembly facility, as contemplated by this invention.

FIG. 3 is a diagram of one embodiment of a system which includes an electronic transmission or communication system or link 152 between a stencil designer or job shop, and the stencil cutter 151 (which may be as shown and described in other figures such as FIG. 5), located in an assembly facility 153, as contemplated by embodiments of this invention. It will be appreciated by those of ordinary skill in the art that the transmission or communication link 152 may also be any one of a number of different links, such as direct telephone line connection, internet connection, wireless connection, intra-net within a company and others, all within the contemplation of this invention. It will also be appreciated by those of ordinary skill in the art that the transmission or communication line or link 152 need not be directly with the stencil cutter 151, but instead may be elsewhere within the assembly facility 153, or within a sufficiently close proximity of the stencil cutter 151 or assembly facility 150, such that the adjusted solder stencil data is timely for the particular operations.

FIG. 4 is a front elevation schematic representation of an embodiment of part of a laser based solder paste stencil cutting machine or device contemplated by an embodiment of this invention. FIG. 4 illustrates the solder paste stencil cutting machine 180 or device, laser 183, laser stand 185, laser power supply 186, signal driver 187, which may for instance be an Opto22 signal driver, chiller 189, table 193, controller (personal computer or "PC" controller) for the motion system (which may be an Anoarad controller if the Anorad motion system referred to elsewhere herein is utilized), enclosure 181 for the laser cutting area and motion system, viewing window 182 in enclosure 181, laser beam delivery system 184, chip removal conduit 192 (which may also be referred to as a chip control conduit 192), vacuum 190 and chip collection bin 191 for the chip removal system. A high voltage brush-less D.C. servo amplifier, also available from Anorad, may also be utilized in this invention.

It will be appreciated by those of ordinary skill in the art that any one of the components shown and described with respect to FIG. 4, may be any one of a number of different sources or types, all within the contemplation of this invention. For instance the laser system, including controllers and other delivery components, may be purchased by individual components or pre-packaged systems, from any one of multiple laser manufacturers known in the art, such as Lee Lasers. Lee Lasers is a Dover Industries Company, Orlando, Fla., and a series 600 pulsed nd:YAG laser system is one example of a laser system which may be utilized within the contemplation of this invention.

FIG. 5 is a perspective view of one embodiment of part of a laser based solder paste stencil cutting machine or device contemplated by an embodiment of this invention. FIG. 5 illustrates solder paste stencil manufacturing or production machine or device 250 connected by transmission media 281 to remote location 280. It will be appreciated that the remote location 280 need not be connected directly to the system, as stated elsewhere herein.

FIG. 5 further shows laser 251, laser support stand 259, laser deliver system 252, motion system with motion system 254 and 255 [a magnetic motion system available from Anorad], which may cause movement in the direction of arrows 261 and 262, table 253, stencil workpiece frame 258, stencil workpiece 257 being cut by the laser, and clamps 260 holding stencil workpiece frame 258 on workpiece table 258 or adapter.

Figure 6:
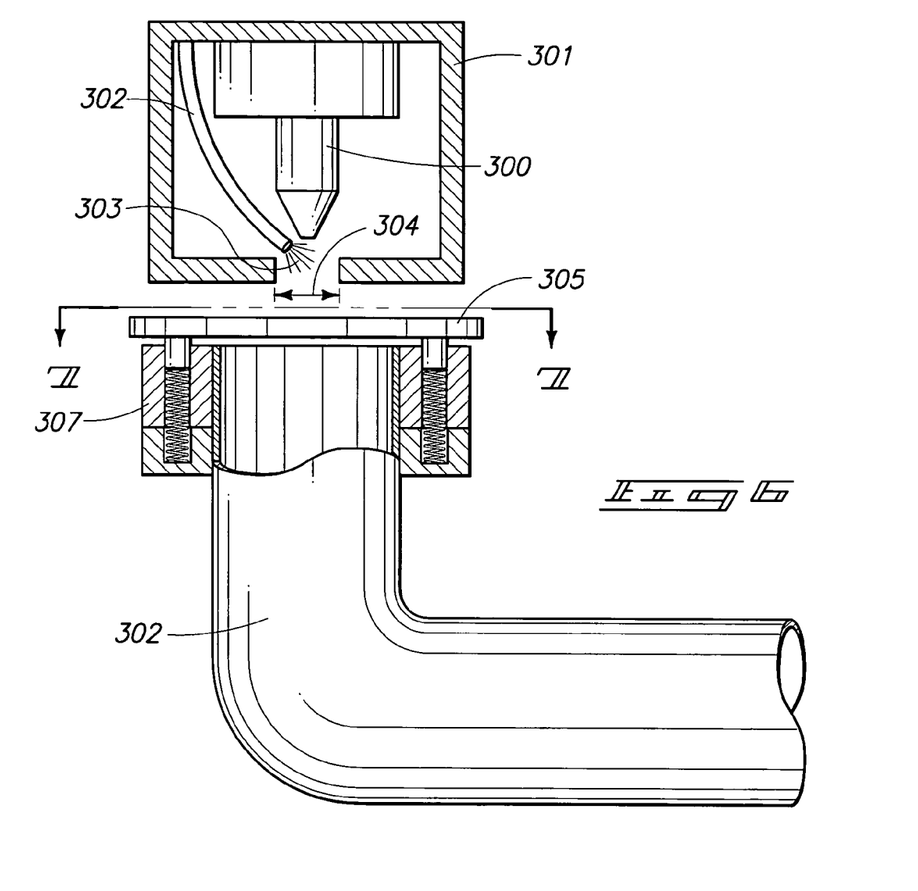
FIG. 6 is an elevation section view of an embodiment of a laser enclosure and arrangement, including a chip removal or control system, contemplated by an embodiment of this invention.

FIG. 5 further illustrates computer display 270, keyboard 271, processor housing 272, the controller 275 or personal computer based processor controller for the motion system, signal driver or amplifier 275, FIG. 6 is an elevation section view of an embodiment of a laser enclosure and arrangement, including a chip removal or control system, contemplated by an embodiment of this invention. FIG. 6 illustrates air conduit 302 which is operatively connected to a vacuum or cut piece collection system which draws air away from the laser cutting area, thereby drawing cut-pieces or chips away. FIG. 6 shows protective laser enclosure 301, laser beam aperture 304, laser head 300, oxygen or gas supply hose 302 and gas 303 released in the cutting area. While the gas utilized may be oxygen, this invention is not limited to any one particular gas and oxygen is merely one of several which may be used within the contemplation of this invention.

A calibration plate 305 is shown attached to the table framework 307 in FIG. 6, which is used to calibrate the laser and table. During the laser cutting, the calibration plate 305 need not be attached to the table, but instead the stencil workpiece and stencil framework (not shown in FIG. 6) would be operatively attached to the cutting table.

Figure 7:
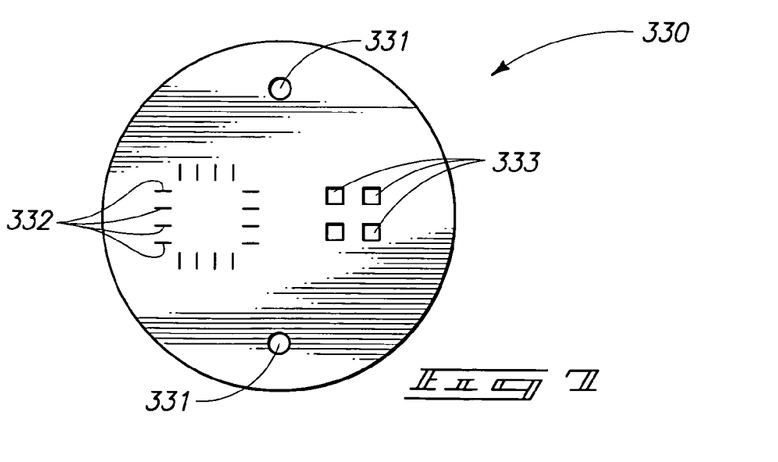
FIG. 7 is a top view of an exemplary solder paste stencil, which may be a calibration stencil or an actual workpiece.

FIG. 7 is a top view of an exemplary solder paste stencil calibration plate as shown in FIG. 6, which may be used to calibrate the laser system before a stencil cut is made. FIG. 7 shows calibration plate 330 with attachment apertures 331, calibration apertures 333 and calibration slots 332. The calibration of laser systems is well known to those of ordinary skill in the art and will not therefore be discussed in any further detail.

As will be appreciated by those of reasonable skill in the art, there are numerous embodiments to this invention, and variations of elements and components which may be used, all within the scope of this invention. One embodiment of this invention, for example, is a method for assembling a plurality of printed circuit boards at a printed circuit board assembly facility, comprising: producing a first solder paste stencil based on a first solder paste stencil data set; utilizing the first solder paste stencil to apply solder paste to a first printed circuit board at a printed circuit board assembly facility; identifying a solder paste error condition with solder paste error information on the first printed circuit board; transmitting the solder paste error information for remote analysis; generating an adjusted first solder paste stencil data set; transmitting the adjusted first solder paste stencil data set to the printed circuit board assembly facility; utilizing the adjusted first solder paste stencil data set to produce an adjusted first solder paste stencil based on the adjusted first solder paste stencil data; and utilizing the adjusted first solder paste stencil to assemble a second printed circuit board without the solder paste error condition.

In additional embodiments from that stated in the preceding paragraph, the invention may be further wherein: the solder paste stencil data set is transmitted from the remote location directly to the solder paste stencil production machine in the printed circuit board assembly facility; and further wherein the solder paste stencil data set is transmitted from the remote location directly to the solder paste stencil production machine in the printed circuit board assembly facility via a public communication network; and/or further wherein the solder paste stencil data set is transmitted from the remote location directly to the solder paste stencil production machine in the printed circuit board assembly facility via a private intranet communication network.

In yet another additional embodiment to the one set forth in the second preceding paragraph, the invention may be further wherein the printed circuit board is a first printed circuit board and the embodiment further comprises: identifying a solder paste error condition with solder paste error information on the first printed circuit board; transmitting the solder paste error information to the remote location for analysis; generating an adjusted first solder paste stencil data set at the remote location; transmitting the adjusted first solder paste stencil data set to the printed circuit board assembly facility; utilizing the adjusted first solder paste stencil data set to produce an adjusted first solder paste stencil based on the adjusted first solder paste stencil data; and utilizing the adjusted first solder paste stencil to assemble a second printed circuit board without the solder paste error condition.

In another method embodiment of the invention, a method for assembling a plurality of printed circuit boards at a printed circuit board assembly facility is provided, which comprises: providing a solder paste stencil production machine at the printed circuit board assembly facility, the solder paste stencil production machine being configured to produce a solder paste stencil suitable for use to apply solder to a printed circuit board; transmitting printed circuit board data regarding the printed circuit board to a remote location for manipulation; manipulating the printed circuit board data at the remote location to generate a solder paste stencil data set; transmitting the solder paste stencil data set from the remote location to the printed circuit board assembly facility; and utilizing the solder paste stencil data set in the solder paste stencil production machine to produce the solder paste stencil suitable for use to apply solder to the printed circuit board.

In additional embodiments from that stated in the preceding paragraph, the invention may be further wherein: the solder paste stencil data set is transmitted from the remote location directly to the solder paste stencil production machine in the printed circuit board assembly facility; and further wherein the solder paste stencil data set is transmitted from the remote location directly to the solder paste stencil production machine in the printed circuit board assembly facility via a public communication network; and/or further wherein the solder paste stencil data set is transmitted from the remote location directly to the solder paste stencil production machine in the printed circuit board assembly facility via a private intranet communication network.

In yet another additional embodiment to the one set forth in the second preceding paragraph, the invention may be further wherein the printed circuit board is a first printed circuit board and the embodiment further comprises: identifying a solder paste error condition with solder paste error information on the first printed circuit board; transmitting the solder paste error information to the remote location for analysis; generating an adjusted first solder paste stencil data set at the remote location; transmitting the adjusted first solder paste stencil data set to the printed circuit board assembly facility; utilizing the adjusted first solder paste stencil data set to produce an adjusted first solder paste stencil based on the adjusted first solder paste stencil data; and utilizing the adjusted first solder paste stencil to assemble a second printed circuit board without the solder paste error condition.

In another embodiment of this invention, a solder paste stencil production system is provided, which comprises: a workpiece holding framework configured to retain a first stencil workpiece; a laser cutting device positioned relative to the workpiece holding framework to enable it to cut the first stencil workpiece retained in the workpiece holding framework; a motion system operatively connected to one of the laser cutting device and workpiece holding framework, such that movement generated by the motion system causes the laser cutting device to cut a desired pattern on the first stencil workpiece; the motion system further utilizing a stencil data set defining the movement to be generated by the motion system to cut the first stencil workpiece; a communication port configured for connection between the motion system and a remote location, to receive an electronic transmission of an adjusted stencil data set for use by the motion system in laser cutting an adjusted desired pattern on a second stencil workpiece.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method for assembling a plurality of printed circuit boards at a printed circuit board assembly facility, comprising:
   producing a first solder paste stencil based on a first solder paste stencil data set;
   utilizing the first solder paste stencil to apply solder paste to a first printed circuit board at a printed circuit board assembly facility;
   identifying a solder paste error condition with solder paste error information on the first printed circuit board;
   transmitting the solder paste error information for remote analysis;
   generating an adjusted first solder paste stencil data set;
   transmitting the adjusted first solder paste stencil data set to the printed circuit board assembly facility;
   utilizing the adjusted first solder paste stencil data set to produce an adjusted first solder paste stencil based on the adjusted first solder paste stencil data; and
   utilizing the adjusted first solder paste stencil to assemble a second printed circuit board without the solder paste error condition.

2. A method for assembling a plurality of printed circuit boards at a printed circuit board assembly facility as recited in claim 1, and further wherein the solder paste stencil data set is transmitted from the remote location directly to the solder paste stencil production machine in the printed circuit board assembly facility.

3. A method for assembling a plurality of printed circuit boards at a printed circuit board assembly facility as recited in claim 2, and further wherein the solder paste stencil data set is transmitted from the remote location directly to the solder paste stencil production machine in the printed circuit board assembly facility via a public communication network.

4. A method for assembling a plurality of printed circuit boards at a printed circuit board assembly facility as recited in claim 2, and further wherein the solder paste stencil data set is transmitted from the remote location directly to the solder paste stencil production machine in the printed circuit board assembly facility via a private intranet communication network.

5. A method for assembling a plurality of printed circuit boards at a printed circuit board assembly facility as recited in claim 1, and further wherein the printed circuit board is a first printed circuit board, and further comprising:
   identifying a solder paste error condition with solder paste error information on the first printed circuit board;
   transmitting the solder paste error information to the remote location for analysis;
   generating an adjusted first solder paste stencil data set at the remote location;
   transmitting the adjusted first solder paste stencil data set to the printed circuit board assembly facility;
   utilizing the adjusted first solder paste stencil data set to produce an adjusted first solder paste stencil based on the adjusted first solder paste stencil data; and
   utilizing the adjusted first solder paste stencil to assemble a second printed circuit board without the solder paste error condition.

6. A method for assembling a plurality of printed circuit boards at a printed circuit board assembly facility, comprising:

providing a solder paste stencil production machine at the printed circuit board assembly facility, the solder paste stencil production machine being configured to produce a solder paste stencil suitable for use to apply solder to a printed circuit board;

transmitting printed circuit board data regarding the printed circuit board to a remote location for manipulation;

manipulating the printed circuit board data at the remote location to generate a solder paste stencil data set;

transmitting the solder paste stencil data set from the remote location to the printed circuit board assembly facility; and utilizing the solder paste stencil data set in the solder paste stencil production machine to produce the solder paste stencil suitable for use to apply solder to the printed circuit board.

7. A method for assembling a plurality of printed circuit boards at a printed circuit board assembly facility as recited in claim 6, and further wherein the solder paste stencil data set is transmitted from the remote location directly to the solder paste stencil production machine in the printed circuit board assembly facility.

8. A method for assembling a plurality of printed circuit boards at a printed circuit board assembly facility as recited in claim 7, and further wherein the solder paste stencil data set is transmitted from the remote location directly to the solder paste stencil production machine in the printed circuit board assembly facility via a public communication network.

9. A method for assembling a plurality of printed circuit boards at a printed circuit board assembly facility as recited in claim 7, and further wherein the solder paste stencil data set is transmitted from the remote location directly to the solder paste stencil production machine in the printed circuit board assembly facility via a private intranet communication network.

10. A method for assembling a plurality of printed circuit boards at a printed circuit board assembly facility as recited in claim 6, and further wherein the printed circuit board is a first printed circuit board, and further comprising:

identifying a solder paste error condition with solder paste error information on the first printed circuit board;

transmitting the solder paste error information to the remote location for analysis;

generating an adjusted first solder paste stencil data set at the remote location;

transmitting the adjusted first solder paste stencil data set to the printed circuit board assembly facility;

utilizing the adjusted first solder paste stencil data set to produce an adjusted first solder paste stencil based on the adjusted first solder paste stencil data; and utilizing the adjusted first solder paste stencil to assemble a second printed circuit board without the solder paste error condition.

* * * * *